(12) United States Patent
Kuo

(10) Patent No.: US 7,338,845 B2
(45) Date of Patent: Mar. 4, 2008

(54) FABRICATION METHOD OF A LOW-TEMPERATURE POLYSILICON THIN FILM TRANSISTOR

(75) Inventor: Cheng-Chang Kuo, Taoyuan (TW)

(73) Assignee: Au Optronics Corporation, Hsinchu (TW)

( * ) Notice: Subject to any disclaimer, the term of this patent is extended or adjusted under 35 U.S.C. 154(b) by 66 days.

(21) Appl. No.: 11/306,811

(22) Filed: Jan. 12, 2006

(65) Prior Publication Data

US 2006/0199316 A1 Sep. 7, 2006

Related U.S. Application Data

(62) Division of application No. 10/710,844, filed on Aug. 6, 2004.

(30) Foreign Application Priority Data

Apr. 6, 2004 (TW) .............................. 93109432 A

(51) Int. Cl.
*H01L 21/00* (2006.01)

(52) U.S. Cl. ...................... 438/151; 438/158; 438/166; 257/E21.414

(58) Field of Classification Search ................ 438/151, 438/158, 166; 257/E21.414
See application file for complete search history.

(56) References Cited

U.S. PATENT DOCUMENTS 5,834,071 A * 11/1998 Lin ............................ 427/578
5,995,174 A * 11/1999 Ukita ........................... 349/43
6,093,586 A * 7/2000 Gosain et al. .............. 438/162
6,391,693 B1 * 5/2002 Cho et al. ................... 438/160
6,504,175 B1 * 1/2003 Mei et al. ..................... 257/66
6,504,182 B2 * 1/2003 Green et al. ................. 257/98
6,570,552 B2 * 5/2003 Yamazaki .................... 345/98
6,693,044 B1 * 2/2004 Yamazaki et al. .......... 438/745
6,855,954 B1 * 2/2005 Zhang .......................... 257/59
2003/0207507 A1 * 11/2003 Gosain et al. .............. 438/166

* cited by examiner

*Primary Examiner*—Michael Lebentritt
*Assistant Examiner*—Stanetta Isaac
(74) *Attorney, Agent, or Firm*—Jianq Chyun IP Office

(57) ABSTRACT

An LTPS-TFT structure comprises a gate, a gate dielectric layer, a patterned silicon layer, a patterned insulating layer, an ohmic contact layer and a source/drain layer. The gate and the gate dielectric layer are disposed on the substrate. The patterned silicon layer and the patterned insulating layer are disposed on the gate dielectric layer over the gate. The patterned silicon layer comprises a polysilicon channel region and an amorphous silicon hot carrier restrain region. The ohmic contact layer is disposed on a portion of the patterned silicon layer other than the polysilicon channel region and the amorphous silicon hot carrier restrain region and a portion of the patterned insulating layer over the amorphous silicon hot carrier restrain region. The source/drain layer is disposed on the ohmic contact layer and the gate dielectric layer.

15 Claims, 11 Drawing Sheets

FABRICATION METHOD OF A LOW-TEMPERATURE POLYSILICON THIN FILM TRANSISTOR

CROSS-REFERENCE TO RELATED APPLICATION

This application is a divisional of a prior application Ser. No. 10/710,844, filed Aug. 6, 2004, which claims the priority benefit of Taiwan application serial no. 93109432, filed Apr. 6, 2004. All disclosures are incorporated herewith by reference.

BACKGROUND OF THE INVENTION

1. Field of the Invention

The present invention relates to a fabrication method of a transistor, and more particularly to a fabrication method of a low-temperature polysilicon thin film transistor (LTPS-TFT).

2. Description of the Related Art

Generally, devices use switches to control the operation thereof. For example, active matrix displays use thin film transistors (TFT) as driving components. According to the material of a channel layer of the TFT, the types of the TFT include amorphous silicon TFT and polysilicon TFT. Based on the position of the channel layer corresponding to that of the gate, the types of TFT also include top-gate TFT and bottom-gate TFT. The bottom-gate TFT has an insulating/amorphous silicon layer interface which is capable of preventing contamination during process. The fabrication method can also be integrated with the back-channel etching technology. The bottom-gate TFT, therefore, is more popularly used for the switching devices of liquid crystal displays. Furthermore, compared with the amorphous silicon TFT, the polysilicon TFT has low power consumption and high electron mobility. It also gets more attention in the industry as well.

The prior art method of fabricating the polysilicon TFT requires a high temperature process up to 1000° C. Due to the high temperature requirement, the choice of the substrate material that can be applied to the process is limited. By the development of laser technology, the processing temperature can be substantially down to or under 600° C. The polysilicon TFT fabricated by such process is called a low-temperature polysilicon TFT (LTPS-TFT). The technology utilizes the laser annealing process to melt and recrystalize the amorphous silicon layer into polysilicon layer. The normally used laser annealing process is the excimer laser annealing (ELA) process.

Although the polysilicon TFT has the advantages of high carrier mobility and high driving current about $10^{-4}$ μA, it also creates high leakage current about $10^{-9}$ μA. The polysilicon TFT is easy to induce hot carrier effect at the drain region, causing device degradation. With the concern, the light doped drain (LDD) region is applied and disposed between the channel layer and the source/drain region of the transistor to reduce hot carrier effect.

FIGS. 1A-1E are cross-sectional views showing a method of fabricating a prior art LTPS-TFT. Referring to FIG. 1A, a gate 102, a gate dielectric layer 104 and an amorphous silicon layer 106 are sequentially formed on a substrate 100. An ELA process is performed to melt and recrystalize the amorphous silicon layer 106 into a polysilicon layer by the excimer laser beams 118. Referring to FIG. 1B, the polysilicon layer 106a is patterned to form the active region of the thin film transistor.

Referring to FIG. 1C, a silicon oxide layer 108 is formed on the polysilicon layer 106a over the gate 102. The silicon oxide layer 108 serves as a mask for implantation of ions 130 to form the ohmic contact layer 110 of the transistor. The polysilicon layer 106a formed over the gate 102 is the channel layer 112.

Referring to FIG. 1D, another silicon oxide layer 108a is form on the channel layer 112. The silicon oxide layer 108a serves as another mask for lightly-doping 140 to form the LDD region between the channel layer 112 and the ohmic contact layer 110. Referring to FIG. 1E, a source/drain region 116 is formed on the ohmic contact layer 110 and the gate dielectric layer 104 to cover a portion of the silicon oxide layer 108a. Accordingly, a bottom-gate LTPS-TFT 120 is complete.

From the prior art process, at least five masks are required to fabricate the prior art LTPS-TFT 120. In addition, the LDD process is so complicated that the method of fabricating the prior art LTPS-TFT has high manufacturing cost.

SUMMARY OF THE INVENTION

Accordingly, the present invention is directed to a fabrication method of a low-temperature polysilicon thin film transistor (LTPS-TFT) to improve device performance by forming an amorphous silicon hot carrier restrain region.

The present invention is also directed to a method of fabricating a LTPS-TFT. The method is capable of reducing manufacturing costs as well as improving device performance by forming an amorphous silicon hot carrier restrain region.

The present invention discloses a LTPS-TFT. The LTPS-TFT comprises a gate, a dielectric gate, a patterned silicon layer, a patterned insulating layer, an ohmic contact layer, and a source/drain layer which are sequentially formed on a substrate. The patterned silicon layer is disposed on the gate dielectric layer and directly over the gate. The patterned silicon layer comprises a polysilicon channel region and an amorphous silicon hot carrier restrain region adjacent thereto. Also, the patterned silicon layer further comprises an edge portion (i.e. a portion of the patterned silicon layer other than the polysilicon channel region and the hot carrier restrain region) underneath the ohmic contact layer. The amorphous silicon hot carrier restrain region is capable of reducing hot carrier effect, preventing degradation of the transistor during the operation of the transistor. The patterned insulating layer covers the patterned silicon layer. The ohmic contact layer is disposed on the edge portion of the patterned silicon layer and a portion of the insulating layer over the amorphous silicon hot carrier restrain region to expose a portion of the patterned insulating layer and contacting the amorphous silicon hot carrier restrain region. The source/drain layer is disposed on the ohmic contact layer, or even on a portion of the substrate.

According to an embodiment of the present invention, the LTPS-TFT further comprises a passivation layer disposed on the source/drain layer to cover the insulating layer.

According to an embodiment of the present invention, the ohmic contact layer comprises a n-type ohmic contact layer or a p-type ohmic contact layer. In other words, the LTPS-TFT of the present invention can be a n-type transistor or a p-type transistor. In an embodiment, the material of the insulating layer comprises silicon nitride or silicon oxide.

The present invention discloses a method of fabricating a LTPS-TFT. First, a gate is formed on a substrate. A gate dielectric layer is formed on the substrate and the gate. A first amorphous silicon layer, a patterned insulating layer and a second amorphous layer are sequentially formed over the gate. The patterned insulating layer is formed on a portion of the first amorphous silicon layer and directly over the gate, and the second amorphous silicon layer is formed on the first amorphous and the patterned insulating layer. The first amorphous silicon layer and the second amorphous silicon layer are patterned to form a first patterned amorphous layer and a second patterned amorphous layer to expose a portion of the gate dielectric layer. The second patterned amorphous silicon layer exposes a portion of the patterned insulating layer.

After forming the second patterned amorphous silicon layer, a portion of the first patterned amorphous silicon layer is melted and then recrystalized to form a polysilicon channel region over the gate. The first patterned amorphous silicon layer under the overlap of the second patterned amorphous and the patterned insulating layer becomes an amorphous silicon hot carrier restrain region. A source/drain layer is formed on the second patterned amorphous silicon layer.

The present invention discloses another method of fabricating a LTPS-TFT. First, a gate is formed on a substrate. A gate dielectric layer is formed on the substrate and the gate. A first amorphous silicon layer, a patterned insulating layer and a second amorphous layer are sequentially formed over the gate. The patterned insulating layer is formed on a portion of the first amorphous silicon layer and directly over the gate, and the second amorphous silicon layer is formed on the first amorphous and the patterned insulating layer. The first amorphous silicon layer and the second amorphous silicon layer are patterned to form a first patterned amorphous layer and a second patterned amorphous layer to expose a portion of the gate dielectric layer. The second patterned amorphous silicon layer exposes a portion of the patterned insulating layer.

After forming the second patterned amorphous silicon layer, a source/drain layer is formed on the second patterned amorphous silicon layer. The material of the source/drain layer can be, for example, metal or other conductive material. Then a first patterned amorphous silicon layer is melted and then recrystalized to form a polysilicon channel region over the gate. The first patterned amorphous silicon layer under the overlap of the second patterned amorphous and the patterned insulating layer becomes an amorphous silicon hot carrier restrain region.

According to the embodiments of the present invention, the method of forming the can be, for example, a laser annealing process. The laser annealing process can be, for example, an excimer laser annealing process.

According to an embodiment of the present invention, the method further comprises doping the first amorphous silicon layer after forming the patterned insulating layer and before forming the second amorphous silicon layer. In another embodiment, the method further comprises doping another portion of the first amorphous silicon layer and the second amorphous silicon layer in the same process after forming the second amorphous silicon layer and before forming the source/drain layer. In the other embodiment, the method further comprises doping another portion of the first patterned amorphous silicon layer and the second patterned amorphous silicon layer outside the polysilicon channel region and the amorphous silicon hot carrier restrain region, after forming the polysilicon channel region and before forming the source/drain layer. After performing the doping process, an activation process is performed for the first patterned amorphous silicon layer and the second patterned amorphous silicon layer which are doped, repairing defects of crystal lattice.

According to the embodiment of the present invention, the first patterned amorphous silicon layer and the second patterned amorphous silicon layer outside the polysilicon channel region and the amorphous silicon hot carrier restrain region are melted and then recrystalized to form the ohmic contact layer while forming the polysilicon channel region.

According to the embodiment of the present invention, the method further comprises forming a passivation layer over the source/drain layer to cover the insulating layer.

Compared with the prior art method of fabricating LTPS-TFT, the fabrication method of the present invention saves a lightly-doped drain (LDD) process and a LDD mask. The manufacturing cost, therefore, is reduced. Moreover, the LTPS-TFT of the present invention has the advantages of high driving current of polysilicon thin film transistors and low leakage current of amorphous thin film transistors.

In order to make the aforementioned and other objects, features and advantages of the present invention understandable, a preferred embodiment accompanied with figures is described in detail below.

DESCRIPTION OF EMBODIMENTS

The present invention discloses a low-temperature polysilicon thin film transistor (LTPS-TFT) structure with an amorphous region between the channel region and the source/drain layer. The amorphous region prevents hot carrier effect by reducing the impact of high-energy elections, under high electrical field, on the source/drain layer. The LTPS-TFT of the present invention can be fabricated by a variety of processes. Following are embodiments of the present invention. The embodiments illustrate the LTPS-TFT and the fabrication method thereof. The scope of the invention, however, is not limited thereto. One of ordinary skill in the art will understand and modify the structure and process in accordance with the embodiments. The modification therefrom still falls within the scope of the present invention.

Figure 1A:
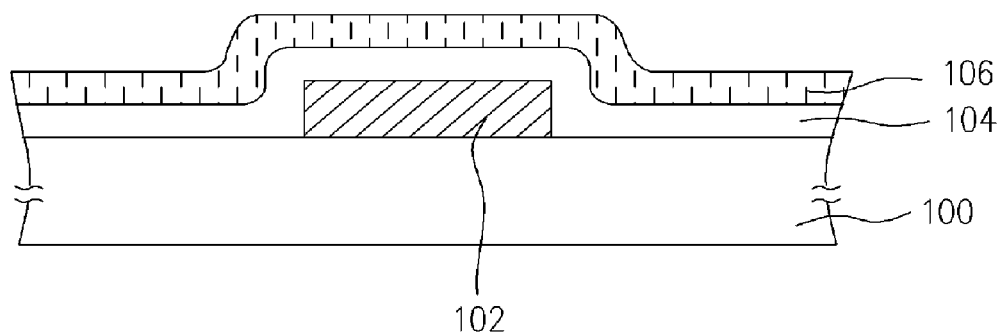
FIGS. 1A-1E are cross-sectional views showing a method of fabricating a prior art LTPS-TFT.
Figure 1B:
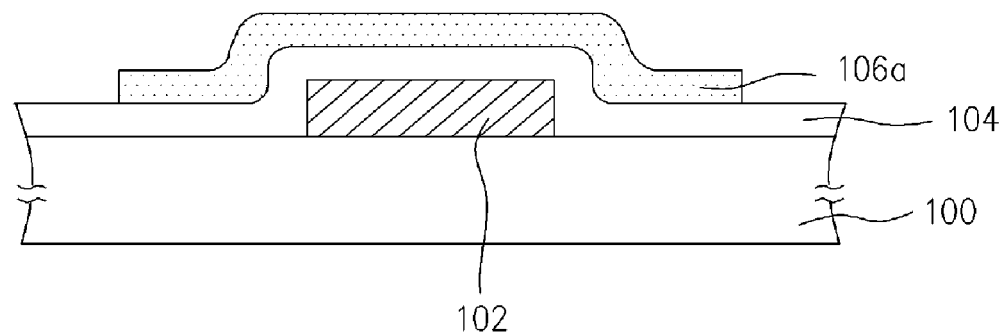
Figure 1C:
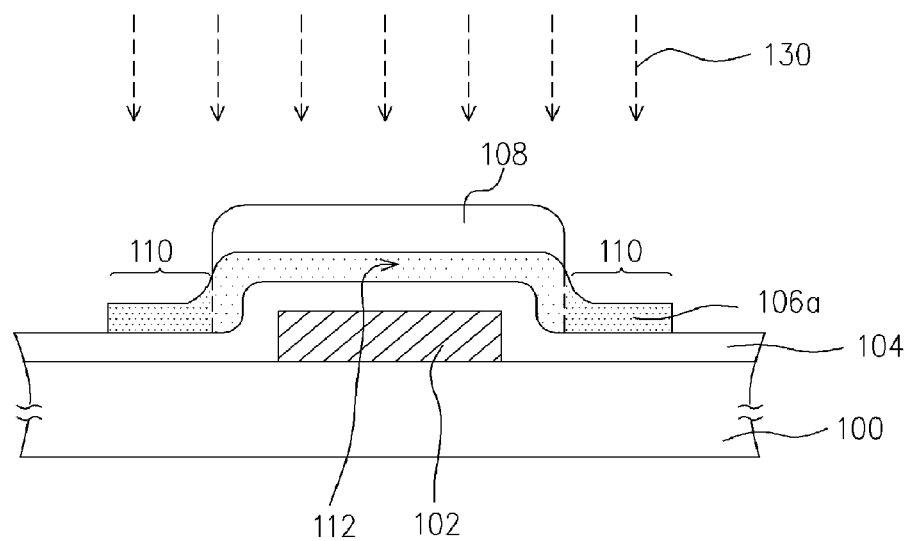
Figure 1D:
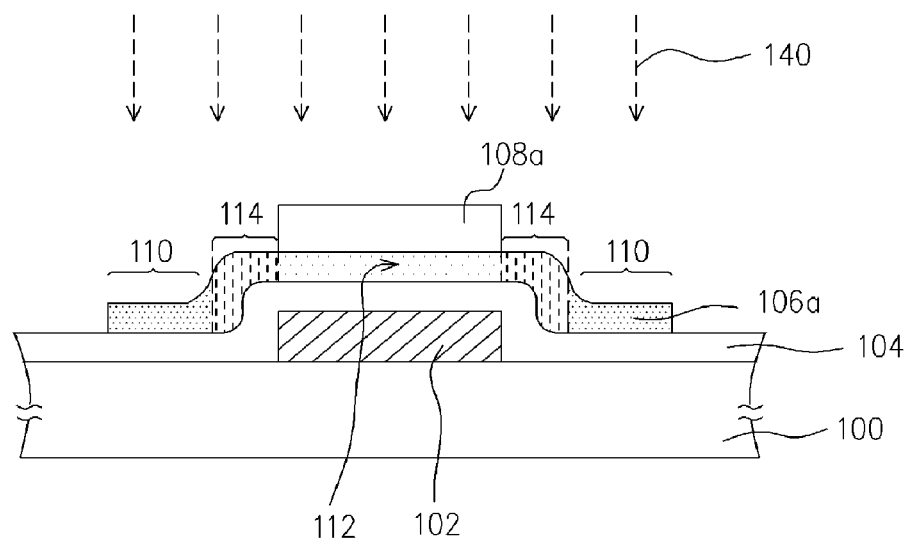
Figure 1E:
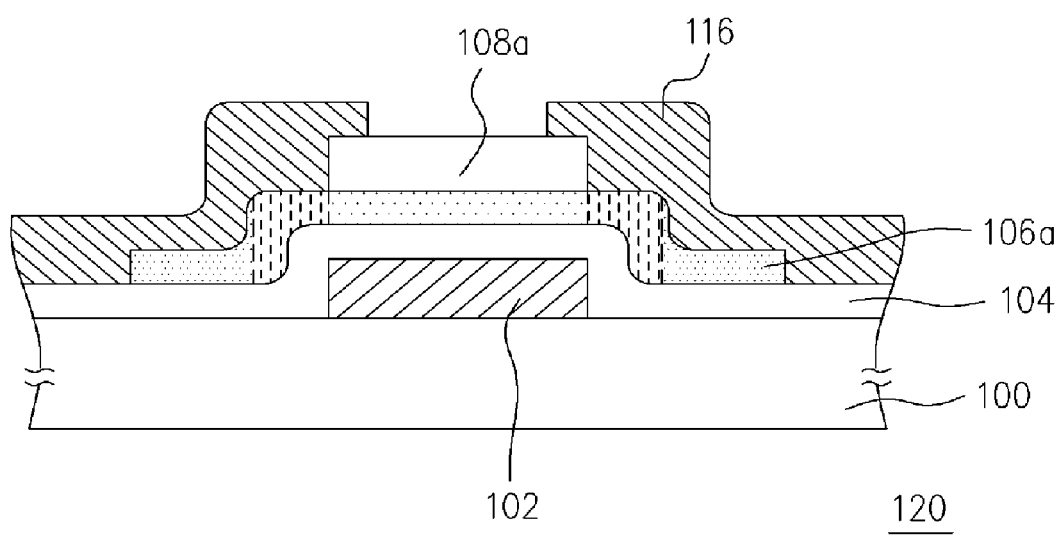
Figure 2A:
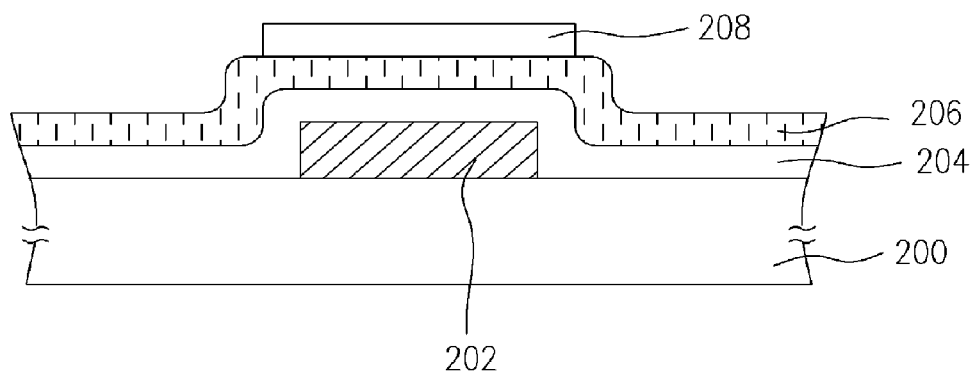
FIGS. 2A-2H are cross-sectional views showing progression steps of the method of fabricating a LTPS-TFT according to the first embodiment of the present invention.

FIGS. 2A-2H are cross-sectional views showing progression steps of the method of fabricating a LTPS-TFT according to the first embodiment of the present invention. Referring to FIG. 2A, a gate 202, a gate dielectric layer 204, a first amorphous silicon layer 206 and a patterned insulating layer 208 are sequentially formed on a substrate 200. The patterned insulating layer 208 is formed on the first amorphous silicon layer 206, and over the gate 202. In this embodiment, the material of the patterned insulating layer 208 includes, for example, silicon nitride, silicon oxide or other dielectric materials.

Figure 2B:
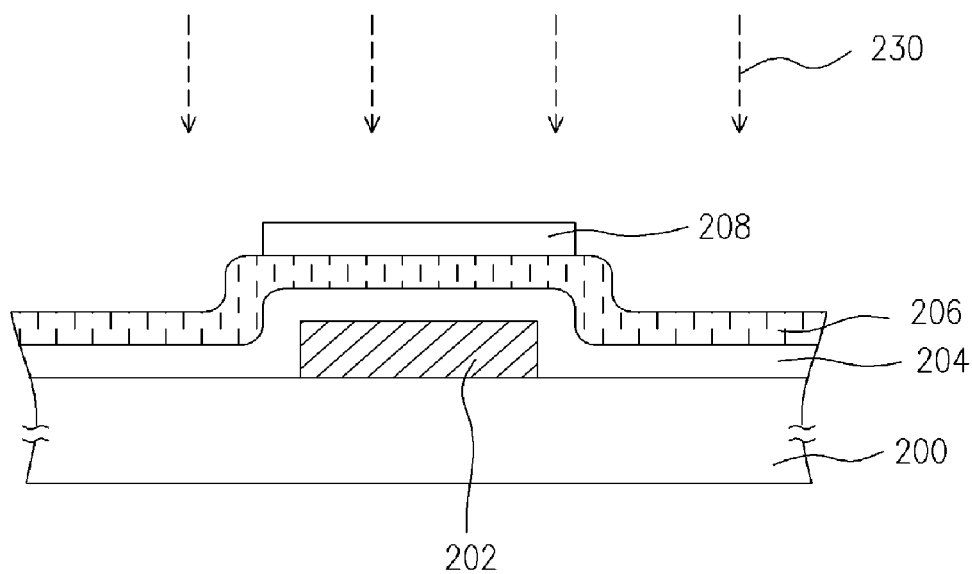

Referring to FIG. 2B, the patterned insulating layer 208 serves as a mask for an implantation process, such as ion implantation. The doping ions 230 is doped into a portion of the first amorphous silicon layer 206, which is not covered by the patterned insulating layer 208 to reduce the resistance thereof. It serves as the ohmic contact layer in the subsequent process. The doping ions 230 can be n-type or p-type doping ions. One of ordinary skill in the art understands that the type of the ions depends on the type of the transistor, such as a n-type or a p-type transistor.

Figure 2C:
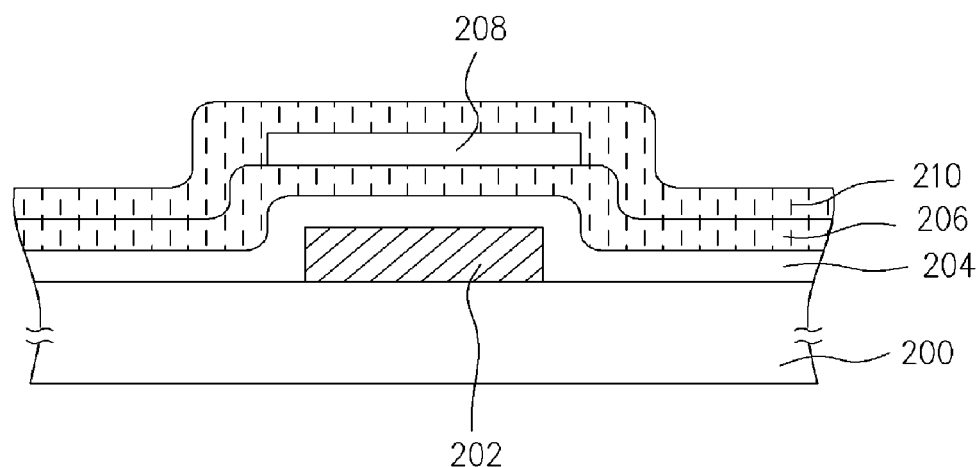

Referring to FIG. 2C, a second amorphous silicon layer 210 is formed on the first amorphous silicon layer 206 to cover the patterned insulating layer 208. The second amorphous silicon layer 210 can be, for example, a doped amorphous silicon layer. The doped amorphous silicon layer 210 can be, for example, formed by doping and depositing the second amorphous silicon layer 210 by, for example, a plasma-enhanced chemical vapor deposition, simultaneously. The process is called in-situ doping process.

Figure 2D:
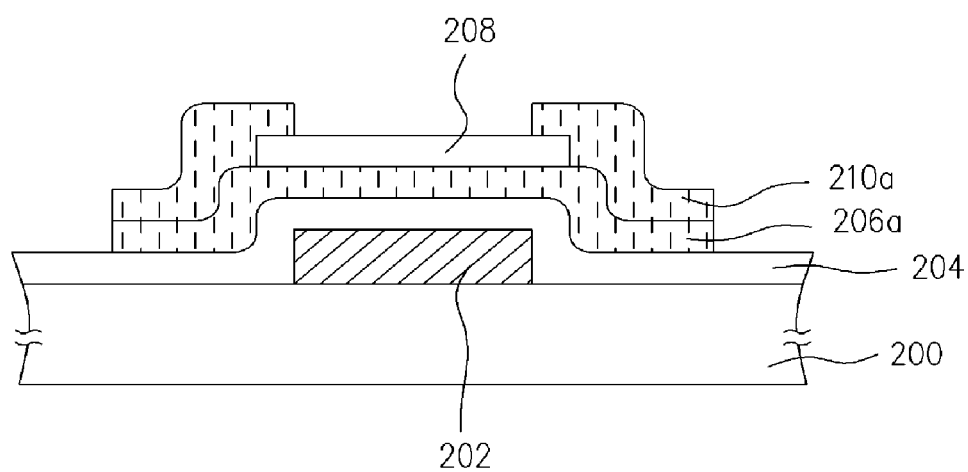

Referring to FIG. 2D, the first amorphous silicon layer 206 and the second amorphous silicon layer 210 are patterned to form a first patterned amorphous silicon layer 206a and a second patterned amorphous silicon layer 210a. The first patterned amorphous silicon layer 206a and the second patterned amorphous silicon layer 210a expose a portion of the gate dielectric layer 204 and to define the active region of the transistor. The second patterned amorphous silicon layer 210a also exposes a portion of the patterned insulating layer 208 over the gate 202. The method of patterning the first amorphous silicon layer 206 and the second amorphous silicon layer 210 includes, for example, a lithographic process and an etching process.

Figure 2E:
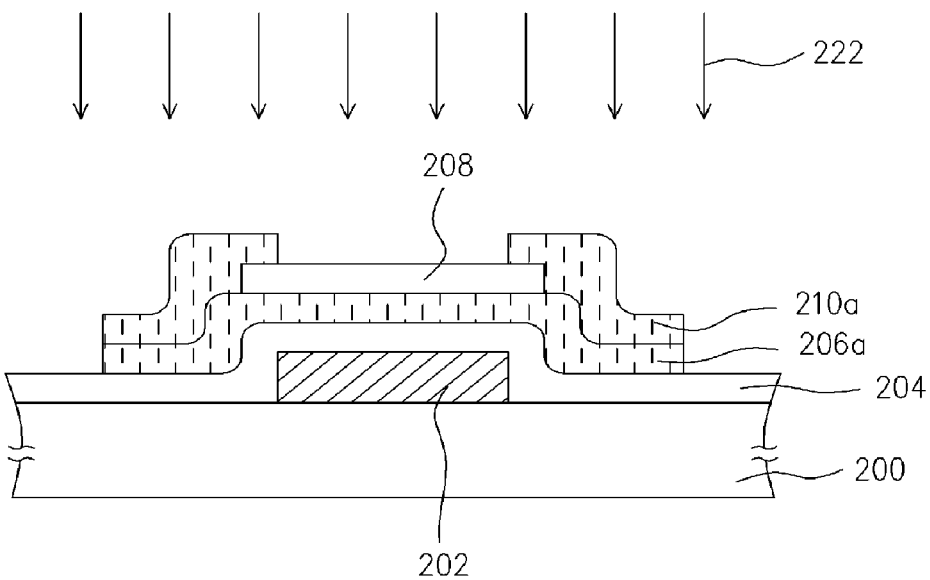
Figure 2F:
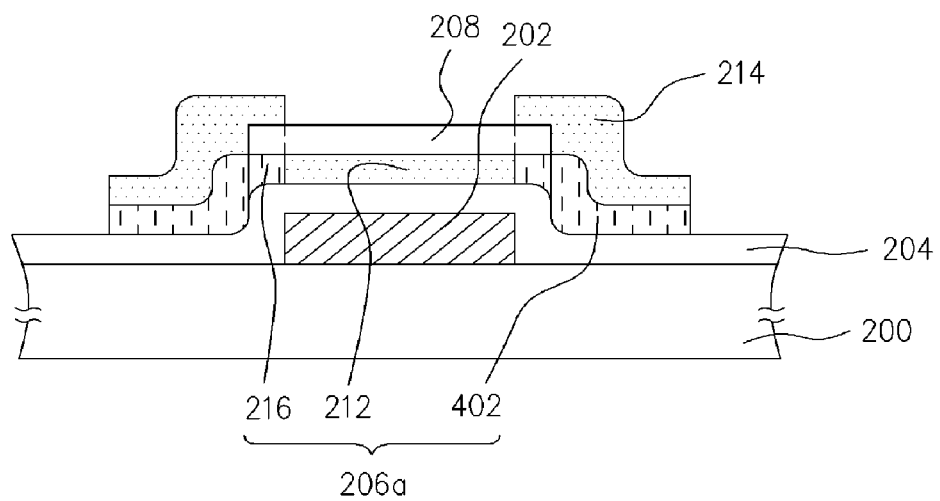

FIG. 2E illustrates a laser annealing process. The laser annealing process of the present invention can be, for example, an excimer laser annealing process. The structure of FIG. 2D is exposed to excimer laser beams 222 to melt and then recrystalize a portion of the first patterned amorphous silicon layer 206a to form the polysilicon channel region 212 as shown in FIG. 2F.

The second patterned amorphous silicon layer 210a is regarded as an energy-absorbing mask for the laser annealing process. Referring to FIGS. 2D-2E, the second patterned amorphous silicon layer 210a absorbs energy from the excimer laser beams 222, transforming into the ohmic contact layer 214 with partial or complete crystallization. The excimer laser beams 222 are absorbed by the second patterned amorphous silicon layer 210a and barely reach the first patterned amorphous silicon layer 206a thereunder. The patterned insulating layer 208 does not absorb the energy of the excimer laser beams 222. Accordingly, the first patterned amorphous silicon layer 206a under the patterned insulating layer 208 absorbs the energy of the excimer laser beams 222, transforming into a polysilicon channel region 212. Because the first patterned amorphous silicon layer 206a under the patterned insulating layer 208 is undoped, the first patterned amorphous silicon layer 206a under the overlap of the second patterned amorphous silicon layer 210 and the patterned insulating layer 208 becomes an undoped amorphous silicon hot carrier restrain region 216. The fabrication method of the present invention precisely defines the position of the polysilicon region and the amorphous silicon region. Due to the high impedance of the amorphous silicon, the amorphous silicon hot carrier restrain region 216 effectively reduces leakage currents of the transistor. In other words, the leakage current is reduced.

While melting and recrystalizing the amorphous silicon layer to form the polysilicon layer, the excimer laser annealing process repairs the defects in the crystal lattice, rearranging the location of atoms to reduce the lattice defects. In this embodiment, the fabrication method saves an activation process for repairing lattice.

Figure 2G:
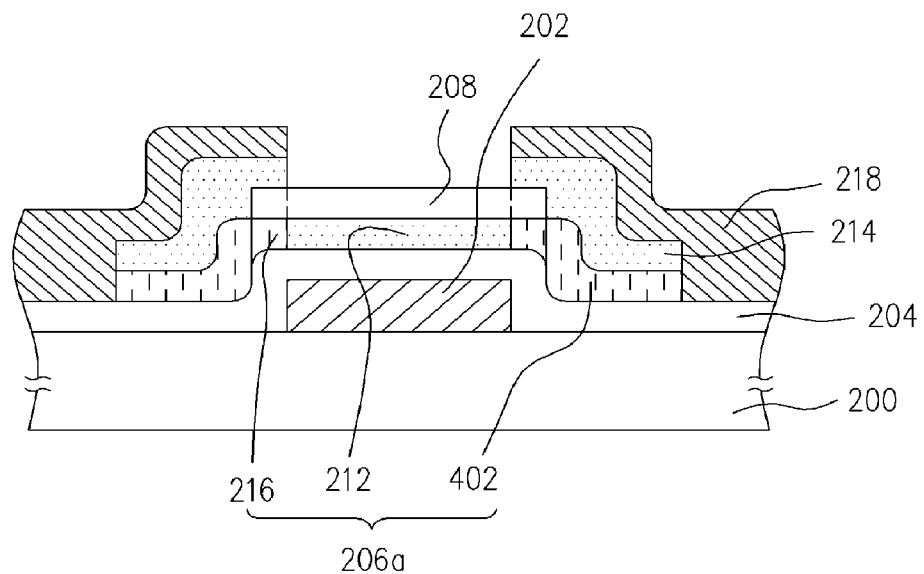

Referring to FIG. 2G, a source/drain layer 218 is formed on the ohmic contact layer 214 and the gate dielectric layer 204. The material of the source/drain layer 218 can be, for example, metal or other conductive material. When the method of the present invention is applied in the process of fabricating displaying devices, the source/drain layer of the thin film transistor is coupled to the data line of the displaying device. The steps of forming the source/drain layer 218 and the data line can be performed in the same process. The fabrication process, therefore, is simplified.

Figure 2H:
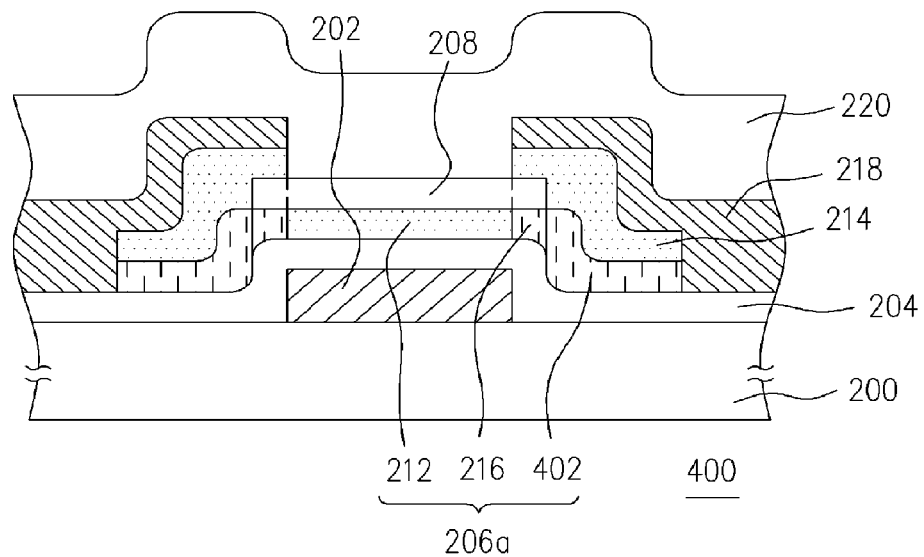

The LTPS-TFT of the present invention is almost done in FIG. 2G. After forming the source/drain layer 218, a passivation layer 220 usually is formed to cover the source/drain layer 218 and the patterned insulating layer 208 to protect internal devices of the LTPS-TFT during the fabrication process as shown in FIG. 2H.

In a second embodiment of the present invention, the laser annealing process is performed before forming the source/drain layer 218. Following is the description of the second embodiment of the present invention.

Figure 3A:
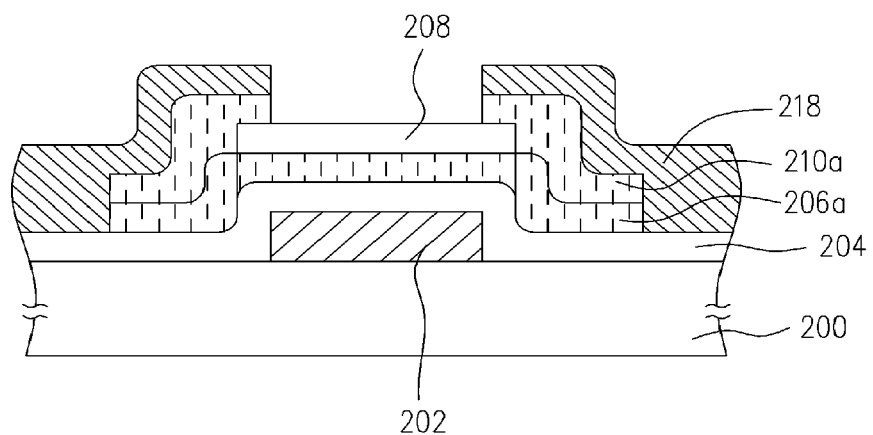
FIGS. 3A-3C are cross-sectional views showing partial steps of the method of fabricating a LTPS-TFT according to the second embodiment of the present invention.
Figure 3B:
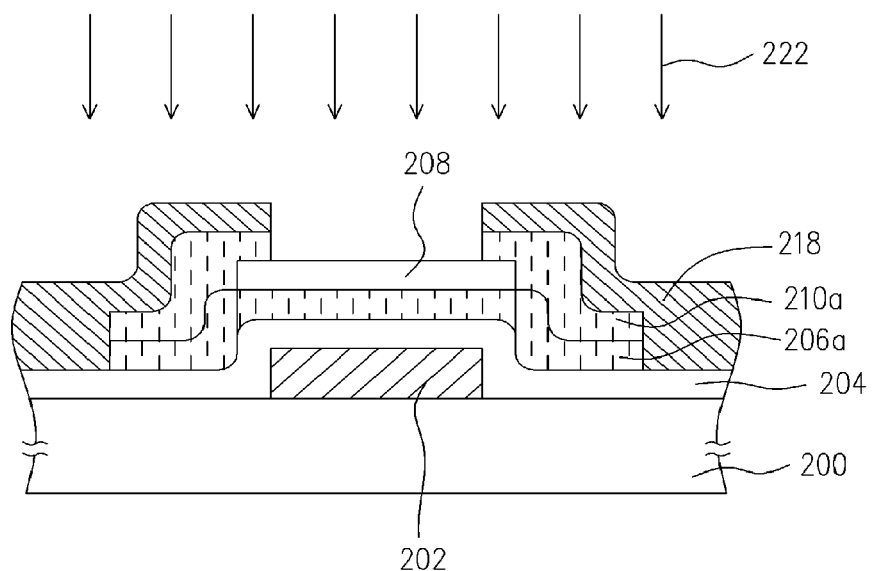
Figure 3C:
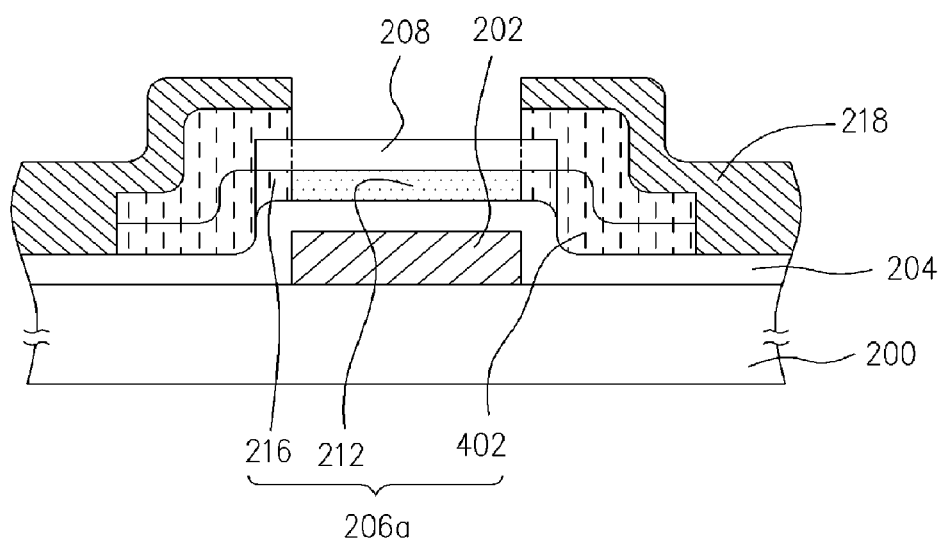

FIGS. 3A-3C are cross-sectional views showing partial steps of the method of fabricating a LTPS-TFT according to the second embodiment of the present invention. Referring to FIG. 3A, after forming the first patterned amorphous silicon layer 206a and the second patterned amorphous silicon layer 210a according to the processes of FIGS. 2A-2D, the source/drain layer 218 is formed on the second patterned amorphous silicon layer 210a and the gate dielectric layer 204. The second patterned amorphous silicon layer 210a serves as the ohmic contact layer of the thin film transistor.

Referring to FIG. 3B, the structure formed in FIG. 3A is exposed to the excimer laser beams 222. During the annealing process, the first patterned amorphous silicon layer 206a above the gate 202 is melted and then recrystalized, transforming into the polysilicon channel region 212 as shown in FIG. 3C. Because of the excellent thermal conductivity of the source/drain layer 218, the second patterned amorphous silicon layer 210a and the first patterned amorphous silicon layer 206a under the source/drain layer 218 do not absorb the energy of the excimer laser beams 222. Both ends of the first patterned amorphous silicon layer 206a, which are adjacent to the polysilicon channel region 212 becomes the amorphous silicon hot carrier restrain region 216. The process of forming the passivation layer (not shown) on the source/drain layer 218 is optional and depends on the requirement of protecting the transistor or relevant process.

The present invention also comprises doping processes based on the requirement of the process. Following are embodiments illustrating the doping processes. The elements of the subsequent embodiments, which are the same as those of the last embodiments, have the materials similar thereto. The detail descriptions are not repeated.

Figure 4A:
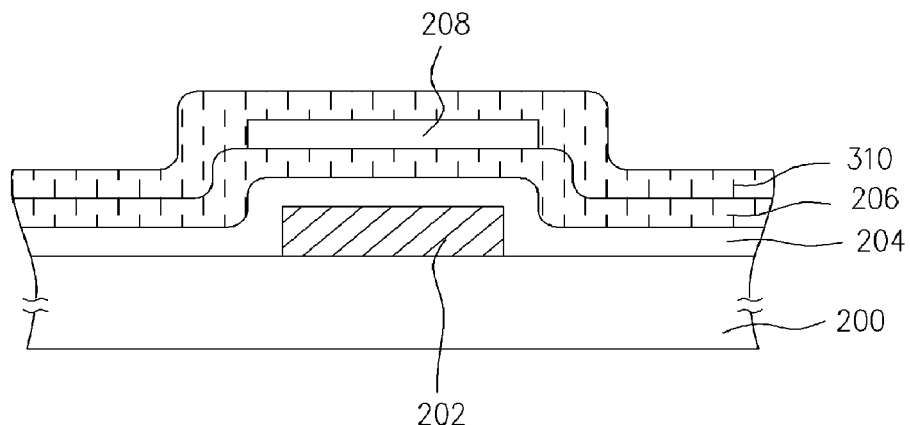
FIGS. 4A-4B are cross-sectional views showing partial steps of the fabricating a LTPS-TFT according to the third embodiment of the present invention.
Figure 4B:
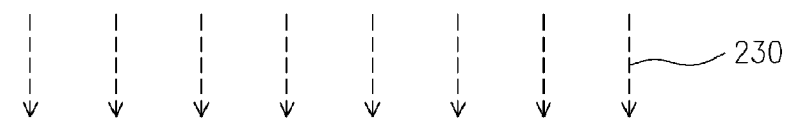
Figure 4B:
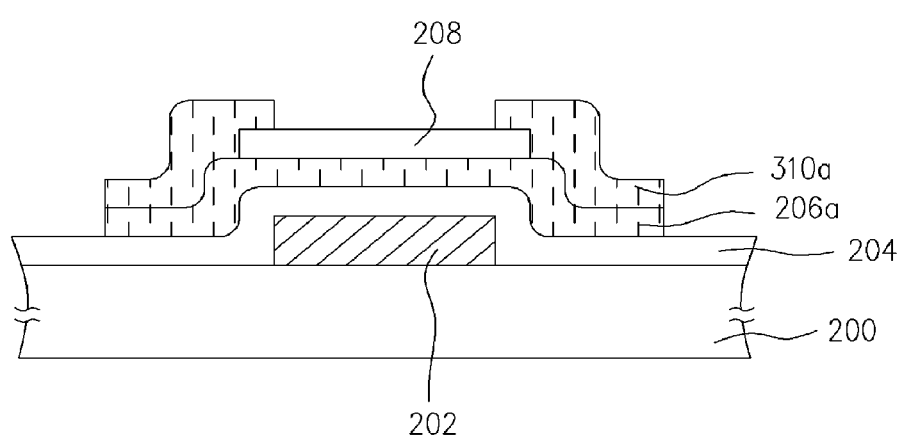

FIGS. 4A-4B are cross-sectional views showing partial steps of the method of fabricating a LTPS-TFT according to the third embodiment of the present invention. Referring to FIG. 4A, after forming the patterned insulating layer 208 over the substrate 200 in accordance with FIG. 2A, a second amorphous silicon layer 310 is formed on the first amorphous silicon layer 206 to cover the patterned insulating layer 208. The second amorphous silicon layer 310 can be, for example, a doped or an undoped amorphous silicon layer.

Referring to FIG. 4B, a first patterned amorphous silicon layer 206a and a second patterned amorphous silicon layer 310a are formed according to the description of FIG. 2D. The patterned insulating layer 208 serves as a mask for an implantation process to implant ions 230 into the first patterned amorphous silicon layer 206a and the second patterned amorphous silicon layer 310a. The subsequent processes are similar to those of the last embodiments.

In the fourth embodiment, a laser annealing process is performed prior to the doping process of the third embodiment. Following is the description of the fourth embodiment.

Figure 5A:
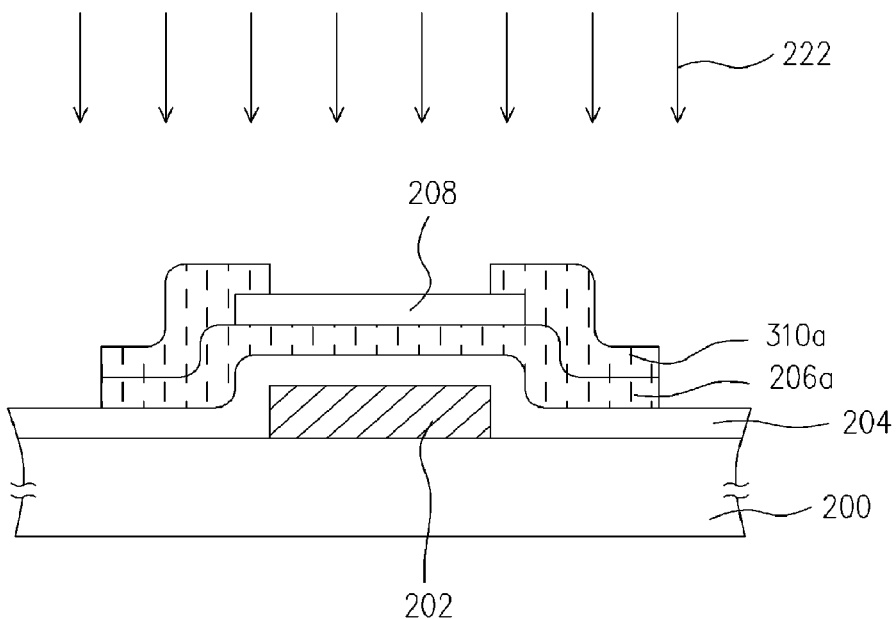
FIGS. 5A-5B are cross-sectional views showing partial steps of the fabricating a LTPS-TFT according to the fourth embodiment of the present invention.
Figure 5B:
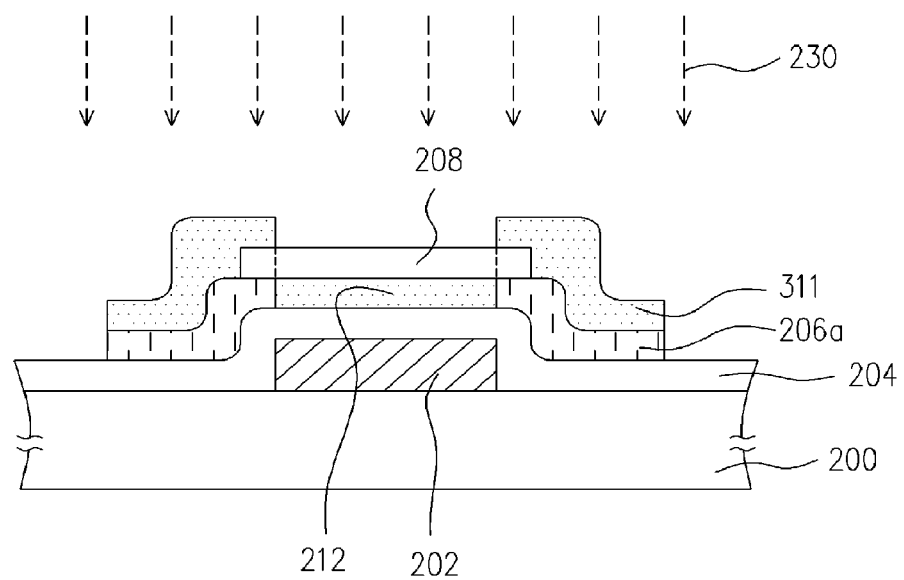

Referring to FIG. 5A, after forming the structure in FIG. 4A, an excimer laser annealing process with excimer laser beams 222 is performed to melt and then recrystalized a portion of the first patterned amorphous silicon layer 206a transforming into the polysilicon channel region 212 shown in FIG. 5B. Similar to the first embodiment, the second patterned amorphous silicon layer 310a, during the laser annealing process, absorbs the energy of the excimer laser beams 222, transforming into the patterned polysilicon layer 311 shown in FIG. 5B.

Referring to FIG. 5B, an implantation process is performed to implant ions 230 into the patterned polysilicon layer 311 and the first amorphous silicon layer 206a uncovered by the patterned insulating layer 208 for forming the ohmic contact layer 214 and the hot carrier restrain region 216 adjacent to the polysilicon channel region 212, respectively, as shown in FIG. 2F.

In this embodiment, because the implantation process is performed after the laser annealing process, an activation process (not shown) is required to repair the lattice defects in the ohmic contact layer 204 and the first patterned amorphous silicon layer 206a thereunder. After the activation process, the subsequent processes are similar to those of last embodiments.

The power of the laser beams applied in the present invention is for the purpose of forming the polysilicon channel region. For such purpose, the laser beams applied in the present invention should not penetrate through the second patterned amorphous silicon layer. Even the power of the laser beam just melts and then recrystalizes the surface silicon atoms of the second patterned amorphous silicon layer. Accordingly, the ohmic contact layer of the present invention comprises amorphous silicon and crystallized silicon.

The present invention discloses various methods of fabricating the LTPS-TFT in FIG. 2H. One of ordinary skill in the art may choose one of them to fabricate a transistor similar to that of the present invention. Following is the detail description of the structure of the LTPS-TFT 400. The methods of fabricating the transistor are described in the last embodiments. Detail descriptions are not repeated.

Referring to FIG. 2H, the LTPS-TFT 400 of the present invention comprises the substrate 200 and the structure thereon. The structure comprises: the gate 202, the gate dielectric layer 204, the patterned insulating layer 208, the patterned silicon layer 206a, the ohmic contact layer 214, the source/drain layer 218 and the passivation layer 220. The gate 202 and the gate dielectric layer 204 are sequentially disposed on the substrate 200. The patterned silicon layer 206a is disposed on the gate dielectric layer 204. The patterned silicon layer 206a comprises a polysilicon channel region 212 over the gate 202 and the hot carrier restrain region 216 adjacent thereto. Also, the patterned silicon layer 206a further comprises an edge portion 402 (i.e. a portion of the patterned silicon layer 206a other than the polysilicon channel region 212 and the hot carrier restrain region 216) underneath the ohmic contact layer 214. The patterned insulating layer 208, which can be, for example, silicon oxide or silicon nitride is disposed on the patterned silicon layer 206a.

The ohmic contact layer 214 is disposed on the edge portion of the patterned silicon layer 206a and a portion of the patterned insulating layer 208 over the amorphous silicon hot carrier restrain region 216 to expose the patterned insulating layer 208 over the polysilicon channel region 212. The ohmic contact layer 214 comprises, for example, a n-type ohmic contact layer or a p-type ohmic layer.

The source/drain layer 218 is disposed on the ohmic contact layer 214 and the gate dielectric layer 204. The passivation layer 220 is disposed on the source/drain layer 218 and the patterned insulating layer 208, protecting the internal devices of the LTPS-TFT 400 from damage during subsequent processes.

Therefore, the present invention has following advantages:

1. Compared with the prior art method of fabricating LTPS-TFT, the fabrication method of the present invention saves a lightly-doped drain (LDD) process and a LDD mask. The manufacturing cost, therefore, is reduced.

2. During the process of fabricating the LTPS-TFT of the present invention, the second patterned amorphous silicon layer serves as an energy-absorbing mask for the laser annealing process. Such amorphous layer precisely defines the amorphous silicon region and the polysilicon region.

3. The amorphous silicon hot carrier restrain region enforces the growth of the crystal from the ends of the polysilicon channel region towards the center thereof. The uniformity of the grain size of the polysilicon channel region is improved.

4. The LTPS-TFT of the present invention has the advantages of high driving current $I_{ON}$ of polysilicon thin film transistors and low leakage current $I_{OFF}$ of amorphous thin film transistors. The transistor has high $I_{ON}/I_{OFF}$ ratio and improves the electrical performance of the LTPS-TFT.

5. It is feasible to modify production lines of amorphous silicon transistor for fabricating LTPS-TFT. The manufacturing cost, therefore, is substantially reduced.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method of fabricating a LTPS-TFT, comprising:
   forming a gate on a substrate;
   forming a gate dielectric layer on the substrate and the gate;
   forming a first amorphous silicon layer, a patterned insulating layer and a second amorphous layer over the gate sequentially, wherein the patterned insulating layer is formed on a portion of the first amorphous silicon layer and over the gate, and the second amorphous silicon layer is formed on the first amorphous and the patterned insulating layer;

patterning the first amorphous silicon layer and the second amorphous silicon layer to form a first patterned amorphous layer and a second patterned amorphous layer to expose a portion of the gate dielectric layer, wherein the second patterned amorphous silicon layer exposes a portion of the patterned insulating layer;

melting and then recrystalizing a portion of the first patterned amorphous silicon layer to form a polysilicon channel region over the gate, wherein the first patterned amorphous silicon layer under an overlap of the second patterned amorphous silicon layer and the patterned insulating layer becomes an amorphous silicon hot carrier restrain region; and forming a source/drain layer on the second patterned amorphous silicon layer and the exposed portion of the patterned insulating layer.

2. The method of fabricating a LTPS-TFT of claim 1, wherein the step of forming the polysilicon channel region further comprises performing a laser annealing process.

3. The method of fabricating a LTPS-TFT of claim 2, wherein the laser annealing process comprises an excimer laser annealing process.

4. The method of fabricating a LTPS-TFT of claim 1, wherein further comprising doping a portion of the first amorphous silicon layer after forming the patterned insulating layer and before forming the second amorphous silicon layer.

5. The method of fabricating a LTPS-TFT of claim 1, wherein further comprising doping another portion of the first amorphous silicon layer and the second amorphous silicon layer after forming the second amorphous silicon layer and before forming the source/drain layer.

6. The method of fabricating a LTPS-TFT of claim 5, wherein further comprising doping the another portion of the first patterned amorphous silicon layer and the second patterned amorphous silicon layer after forming the polysilicon channel region and before forming the source/drain layer.

7. The method of fabricating a LTPS-TFT of claim 6, wherein further comprising performing an annealing activation process for the another portion of the first amorphous silicon layer and the second patterned amorphous silicon layer after doping the another portion of the first amorphous silicon layer and the second patterned amorphous silicon layer and before forming the source/drain layer.

8. The method of fabricating a LTPS-TFT of claim 1, further comprising forming a passivation layer over the source/drain layer to cover the insulating layer.

9. The method of fabricating a LTPS-TFT of claim 1, further comprising melting and then recrystalizing the second patterned amorphous silicon layer while forming the polysilicon channel region.

10. A method of fabricating a LTPS-TFT, comprising:
forming a gate on substrate;
forming a gate dielectric layer on the substrate and the gate;
forming a first amorphous silicon layer, a patterned insulating layer and a second amorphous layer over the gate sequentially, wherein the patterned insulating layer is formed on a portion of the first amorphous silicon layer and over the gate, and the second amorphous silicon layer is formed on the first amorphous and the patterned insulating layer;
patterning the first amorphous silicon layer and the second amorphous silicon layer to form a first patterned amorphous layer and a second patterned amorphous layer to expose a portion of the gate dielectric layer, wherein the second patterned amorphous silicon layer exposes a portion of the patterned insulating layer;
forming a source/drain layer on the second patterned amorphous silicon layer and the exposed portion of the patterned insulating layer; and
melting and then recrystalizing a portion of the first patterned amorphous silicon layer to form a polysilicon channel region over the gate, wherein the first patterned amorphous silicon layer under an overlap of the second patterned amorphous silicon layer and the patterned insulating layer becomes an amorphous silicon hot carrier restrain region.

11. The method of fabricating a LTPS-TET of claim 10, wherein the step of forming the polysilicon channel region further comprises performing a laser annealing process.

12. The method of fabricating a LTPS-TFT of claim 11, wherein the laser annealing process comprises an excimer laser annealing process.

13. The method of fabricating a LTPS-TFT of claim 11, wherein further comprising doping another portion of the first amorphous silicon layer after forming the patterned insulating layer and before forming the second amorphous silicon layer.

14. The method of fabricating a LTPS-TFT of claim 11, wherein further comprising doping another portion of the first amorphous silicon layer and the second amorphous silicon layer after forming the second amorphous silicon layer and before forming the source/drain layer.

15. The method of fabricating a LTPS-TFT of claim 14, further comprising performing an annealing activation process for the another portion of the first amorphous silicon layer and the second patterned amorphous silicon layer after doping the another portion of the first amorphous silicon layer and the second patterned amorphous silicon.

* * * * *